(12) United States Patent
Bevilacqua et al.

(10) Patent No.: US 12,058,938 B2
(45) Date of Patent: Aug. 6, 2024

(54) MEMS PIEZOELECTRIC DEVICE AND CORRESPONDING MANUFACTURING PROCESS

(71) Applicant: STMicroelectronics S.r.l., Agrate Brianza (IT)

(72) Inventors: Maria Fortuna Bevilacqua, Sant-Agata de Goti (IT); Flavio Francesco Villa, Milan (IT); Rossana Scaldaferri, Sapri (IT); Valeria Casuscelli, Naples (IT); Andrea Di Matteo, Naples (IT); Dino Faralli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/722,713

(22) Filed: Apr. 18, 2022

(65) Prior Publication Data
US 2022/0246832 A1  Aug. 4, 2022

Related U.S. Application Data

(62) Division of application No. 16/215,821, filed on Dec. 11, 2018, now Pat. No. 11,417,827, which is a
(Continued)

(30) Foreign Application Priority Data

Dec. 24, 2015 (IT) .................. 102015000087710

(51) Int. Cl.
*H10N 30/30* (2023.01)
*H02N 2/18* (2006.01)
(Continued)

(52) U.S. Cl.
CPC ........... *H10N 30/308* (2023.02); *H02N 2/186* (2013.01); *H10N 30/01* (2023.02); *H10N 30/03* (2023.02);
(Continued)

(58) Field of Classification Search
CPC ......... H01L 41/22; H01L 41/25; H01L 41/29; H01L 41/332; H01L 41/1138;
(Continued)

(56) References Cited

U.S. PATENT DOCUMENTS 8,173,513 B2   5/2012  Villa et al.
8,680,695 B2   3/2014  Huffman et al.
(Continued)

FOREIGN PATENT DOCUMENTS

WO  WO-2006123299 A2 * 11/2006 ........... B06B 1/0292
WO  WO-2007098863 A1 *  9/2007 ........ B81C 1/00246
(Continued)

OTHER PUBLICATIONS

Italian Search Report and Written Opinion for IT Appl. No. 102015000087710 dated Sep. 9, 2016 (8 pages).
(Continued)

*Primary Examiner* — Jeffrey T Carley
(74) *Attorney, Agent, or Firm* — Crowe & Dunlevy LLC

(57) ABSTRACT

A process for manufacturing a MEMS piezoelectric device includes: forming a membrane at a first surface of wafer of semiconductor material further having a second surface (the first and second surfaces being opposite along a vertical axis and extending parallel to a horizontal plane formed by first and second horizontal axes); forming a cavity within the wafer so that the membrane is suspended above the cavity; forming a piezoelectric material layer above a first surface of the membrane; forming an electrode arrangement in contact with the piezoelectric material layer; and forming a proof
(Continued)

mass coupled to a second surface of the membrane opposite to the first surface along the vertical axis. The proof mass deforms the membrane in response to environmental mechanical vibrations. Forming the proof mass includes forming a connection element at a central position between the membrane and the proof mass in the direction of the vertical axis.

3 Claims, 9 Drawing Sheets

Related U.S. Application Data division of application No. 15/163,230, filed on May 24, 2016, now Pat. No. 10,186,654.

(51) Int. Cl.
*H10N 30/01* (2023.01)
*H10N 30/03* (2023.01)
*H10N 30/06* (2023.01)
*H10N 30/082* (2023.01)
*H10N 30/853* (2023.01)
*H10N 30/87* (2023.01)
*H10N 30/88* (2023.01)

(52) U.S. Cl.
CPC ........... *H10N 30/06* (2023.02); *H10N 30/082* (2023.02); *H10N 30/304* (2023.02); *H10N 30/8554* (2023.02); *H10N 30/87* (2023.02); *H10N 30/88* (2023.02)

(58) Field of Classification Search
CPC .... H01L 41/047; H02N 2/186; H10N 30/308; H10N 30/06; H10N 30/01; H10N 30/87; H10N 30/304; H10N 30/082; H10N 30/88; H10N 30/8554; H10N 30/03
See application file for complete search history.

(56) References Cited

U.S. PATENT DOCUMENTS

| | | | |
|---|---|---|---|
| 9,121,864 B2 | 9/2015 | Kim et al. | |
| 9,540,229 B2 * | 1/2017 | Bruno | G08B 7/02 |
| 9,744,765 B2 * | 8/2017 | Giusti | B41J 2/1631 |
| 10,239,748 B2 | 3/2019 | Maggi et al. | |
| 10,630,259 B2 * | 4/2020 | Hurwitz | H03H 9/1014 |
| 10,700,262 B2 * | 6/2020 | Kishimoto | H03H 9/02228 |
| 2003/0119220 A1 * | 6/2003 | MIcak | H10N 30/2042 438/52 |
| 2005/0134153 A1 | 6/2005 | Bachellerie et al. | |
| 2006/0017533 A1 * | 1/2006 | Jahnes | H01H 59/0009 335/78 |
| 2006/0023032 A1 * | 2/2006 | Bibl | H10N 30/2047 347/68 |
| 2006/0244343 A1 * | 11/2006 | Sugahara | H10N 30/2047 310/341 |
| 2007/0273728 A1 | 11/2007 | Bryant et al. | |
| 2010/0259130 A1 | 10/2010 | Eckstein et al. | |
| 2010/0327702 A1 * | 12/2010 | Martin | G10K 9/18 29/25.35 |
| 2011/0056059 A1 * | 3/2011 | Shimizu | B41J 2/161 29/25.35 |
| 2011/0140578 A1 | 6/2011 | Ko et al. | |
| 2011/0146404 A1 * | 6/2011 | Jeung | G01C 25/005 29/25.35 |
| 2012/0161582 A1 | 6/2012 | Chung et al. | |
| 2012/0268527 A1 | 10/2012 | Ellinger et al. | |
| 2013/0130502 A1 * | 5/2013 | Sparks | B81C 1/00158 438/702 |
| 2019/0162753 A1 | 5/2019 | Yang et al. | |

FOREIGN PATENT DOCUMENTS

| | | |
|---|---|---|
| WO | 2011129855 A2 | 10/2011 |
| WO | 2016009079 A1 | 1/2016 |

OTHER PUBLICATIONS

Hajati, Arman et al: "Ultra-Wide Bandwidth Piezoelectric Energy Harvesting," Applied Physics Letters 99.8 (2011): 083105, 2011 American Institute of Physics (3 pages).

Hajati: "Ultra Wide-Bandwidth Micro Energy Harvester," Ph.D Thesis, Massachusetts Institute of Technology, Feb. 2011 (197 pages).

Kim, et al: "Piezoelectric MEMS for Energy Harvesting," MRS Bulletin, vol. 37, Nov. 2012, pp. 1039-1050.

First Office Action and Search Report from co-pending CN Appl. No. 201610482597.7 dated Apr. 2, 2018 (8 pages).

* cited by examiner

MEMS PIEZOELECTRIC DEVICE AND CORRESPONDING MANUFACTURING PROCESS

PRIORITY CLAIM

This application is a divisional from U.S. application patent Ser. No. 16/215,821 filed Dec. 11, 2018, which is a divisional from U.S. patent application Ser. No. 15/163,230 filed May 24, 2016, which claims priority from Italian Application for Patent No. 102015000087710 filed Dec. 24, 2015, the disclosures of which are incorporated by reference.

TECHNICAL FIELD

The present invention relates to a MEMS (Micro-Electromechanical Systems) piezoelectric device and to a corresponding manufacturing process.

The following discussion will make particular reference to use of the MEMS piezoelectric device as an energy micro-generator for energy-harvesting (or energy-scavenging) applications.

BACKGROUND

As it is known, systems for harvesting energy from mechanical or environmental energy sources arouse considerable interest in a wide range of technological fields, for example in the field of portable or mobile electronic apparatuses.

Typically, energy-harvesting systems are designed to harvest and store energy generated by mechanical or environmental sources and to transfer it to a generic load of an electrical type, which may be supplied, or, in the case of an electric battery, recharged. Such systems may, for example, allow to provide portable electronic apparatuses without batteries or to considerably increase the lifetime of batteries of such portable electronic apparatuses.

In particular, an energy-harvesting solution that has been proposed envisages use of a MEMS piezoelectric device capable of converting into electrical energy the energy associated to mechanical vibrations (originating from the environment in which the device is operating or from bodies, with which the device is in contact).

The simplest solution of a MEMS piezoelectric device envisages use of a cantilever structure, which carries at a free end an inertial mass, or "proof mass"; an appropriate piezoelectric material, such as for example PZT (lead zirconate titanate), is placed on the cantilever beam.

In this above solution, mechanical vibrations cause movement of the proof mass and generation of kinetic energy, which is converted into potential elastic energy in the form of mechanical deformation of the cantilever beam and of the associated piezoelectric material.

In particular, the resulting oscillation of the cantilever beam causes tensile and compressive effects in the piezoelectric material and the resulting generation of an electric charge that may be detected at electrodes arranged in contact with the piezoelectric material. In other words, part of the potential elastic energy stored in the cantilever beam is converted into electrical energy.

The above solution has an important disadvantage linked to a very narrow operating frequency band in so far as the cantilever structures are generally designed for having a high quality factor Q. Even slight deviations from the natural resonance frequency of the mechanical structure thus cause a sharp decay of the energy that may be harvested.

However, mechanical vibrations in the environment generally have a wide frequency spectrum, with non-controllable values. It follows that the solution described previously is not typically capable of offering an adequate efficiency in terms of energy harvesting.

To overcome the above drawback, a further solution that has been proposed envisages use of a so-called "doubly clamped" structure, configured to generate stresses that are predominantly of a tensile type on corresponding piezoelectric elements. These devices show a behavior dominated by linear bending in the high-frequency region and with low oscillation amplitudes, and by markedly non-linear stretching in the low-frequency region and with high oscillation amplitudes.

As illustrated schematically in FIG. 1A, this solution envisages use of a pair of thin cantilever elements $1a$, $1b$, i.e. ones having a thickness t along a vertical axis z much lower than a corresponding main extension (or length) along a first horizontal axis x. The cantilever elements $1a$, $1b$ are constrained at a first end to a fixed structure 2, and at a second end to a proof mass 4, which is directly coupled to the cantilever elements $1a$, $1b$ and arranged centrally with respect to the same cantilever elements $1a$, $1b$.

In particular, D1 and D2 in FIG. 1A designate the main extension of the proof mass 4 and the total extension of the structure (given by the sum of the lengths of the cantilever elements $1a$, $1b$ and of the proof mass 4), along the first horizontal axis x.

As illustrated in FIG. 1B, a displacement δ along the vertical axis z of the proof mass 4 as a result of the mechanical vibrations causes tensile stresses of deformation on both of the cantilever elements $1a$, $1b$. In particular, the fact that the proof mass 4 is arranged at the center prevents lateral movements or rotations of the proof mass 4 and enables reduction of the natural oscillation frequency to values of hundreds of Hertz, which practically correspond to the typical values of the spectrum of environmental mechanical vibrations.

An example of MEMS piezoelectric device, in particular an energy-harvesting generator, that uses the doubly clamped solution discussed previously, is described in the document: Hajati Arman, Sang-Gook Kim, "Ultra-wide Bandwidth Piezoelectric Energy Harvesting" Applied Physics Letters 99.8 (2011): 083105, 2011 American Institute of Physics (incorporated by reference).

In brief, and as illustrated in FIG. 2A, the micromechanical structure of the MEMS piezoelectric device described in the above document and designated by 10 comprises a supporting body 11, of semiconductor material, in particular silicon, in which a cavity 12 is provided. A membrane 13 is arranged over the cavity 12 and carries at the center an inner proof mass 14, directly coupled to the membrane 13.

The inner proof mass 14 defines in the membrane 13, laterally with respect to the same proof mass 14, a first cantilever element $15a$ and a second cantilever element $15b$, on which an appropriate piezoelectric material element 16, for example PZT, is placed, contacted by electrodes 17.

During the manufacturing process, the etching leading to formation of the cavity 12 also defines the geometry of the inner proof mass 14 and the dimensions of the cantilever elements $15a$, $15b$, which are thus determined directly by the size of the same inner proof mass 14.

In particular, once again D1 and D2 designate in FIG. 2A the extension of the inner proof mass 14 and, respectively, the main overall extension of the cantilever elements 15a, 15b and of the aforesaid inner proof mass 14.

The micromechanical structure 10 further comprises an outer proof mass 18, having an extension substantially corresponding to the aforesaid dimension D2, coupled, for example using bonding techniques, onto the membrane 13.

During operation, in the presence of environmental vibrations, the cantilever elements 15a, 15b undergo deformation as a result of the joint displacement of the inner and outer proof masses 14, 18, thus generating a corresponding electrical signal at the electrodes 17.

As illustrated in FIG. 2B (where, for reasons of simplicity, the outer proof masses 18 are not illustrated), a plurality of micromechanical structures 10 of the type described previously may advantageously be obtained starting from a same supporting body 11, in order to increase efficiency of generation of electrical energy.

It is noted that the solution described previously is, however, affected by certain important limitations. In particular, the electrical performance depends upon the geometry of the resulting proof mass.

However, it is not possible to increase the dimensions of the inner proof mass 14 beyond a certain threshold in so far as, in this case, the dimensions of the cantilever elements 15a, 15b (and of the corresponding piezoelectric material elements 16) would be excessively reduced; typically, in the micromechanical structure 10, dimension D1 may at the most be equal to one third of dimension D2.

Introduction of the outer proof mass 18 is consequently required to increase the performance of energy generation, starting from the detected mechanical vibrations.

However, coupling of this outer proof mass 18 complicates the manufacturing process (requiring in fact coupling between two distinct wafers of semiconductor material, the so-called "wafer-to-wafer bonding") and leads to a non-negligible possibility of defectiveness following upon dicing of the same wafers.

Furthermore, the geometry of the piezoelectric structure is in this case fixed, being of the doubly clamped type based on the tensile deformation modes of the piezoelectric material, thus limiting the possibilities in designing the characteristics of the micromechanical structure.

There is accordingly a need in the art to overcome, at least in part, the problems that afflict MEMS piezoelectric devices of a known type, and in particular to provide a more efficient solution for harvesting of environmental energy.

SUMMARY

In an embodiment, a MEMS piezoelectric device comprises: a monolithic body of semiconductor material having a first main surface and a second main surface, the first and second main surfaces extending parallel to a horizontal plane formed by a first horizontal axis and a second horizontal axis, the first and second main surfaces further being opposite to one another along a vertical axis; a housing cavity within said monolithic body; a membrane suspended above said housing cavity at the first main surface of said monolithic body; a piezoelectric material layer above a first surface of said membrane; an electrode arrangement in contact with the piezoelectric material layer; and a proof mass coupled to a second surface of the membrane, said second surface opposite to the first surface along the vertical axis, said proof mass configured to cause deformation of the membrane in response to mechanical vibrations, wherein said proof mass is coupled to said membrane by a connection element located in a central position between said membrane and said proof mass in the direction of said vertical axis.

In an embodiment, a process for manufacturing a MEMS piezoelectric device comprises: forming a membrane at a first main surface of wafer of semiconductor material further having a second main surface, the first and second main surfaces extending parallel to a horizontal plane formed by a first horizontal axis and a second horizontal axis, the first and second main surfaces further being opposite to one another along a vertical axis; forming a housing cavity within said wafer so that said membrane is suspended above said housing cavity; forming a piezoelectric material layer above a first surface of said membrane (23); forming an electrode arrangement in contact with the piezoelectric material layer (30); and forming a proof mass coupled to a second surface of the membrane, said second surface opposite to the first surface along the vertical axis, said proof mass configured to deform the membrane in response to environmental mechanical vibrations, wherein forming the proof mass comprises forming said proof mass so that the proof mass is coupled to said membrane by a connection element arranged in a central position between said membrane and said proof mass in the direction of said vertical axis.

In an embodiment, a MEMS piezoelectric device comprises: a body of semiconductor material having a first main surface and a second main surface, the first and second main surfaces extending parallel to a horizontal plane, the first and second main surfaces further being opposite to one another along a vertical axis perpendicular to said horizontal plane; an opening in the second main surface which defines, from said body of semiconductor material, a membrane portion of semiconductor material, a proof mass of semiconductor material and a column of semiconductor material, said column of semiconductor material coupling said proof mass of semiconductor material to a bottom surface of said membrane portion of semiconductor material; a piezoelectric material layer above an upper surface of said membrane portion of semiconductor material, said lower and upper surfaces being opposite to one another along the vertical axis; and an electrode arrangement in contact with the piezoelectric material layer.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 1A:
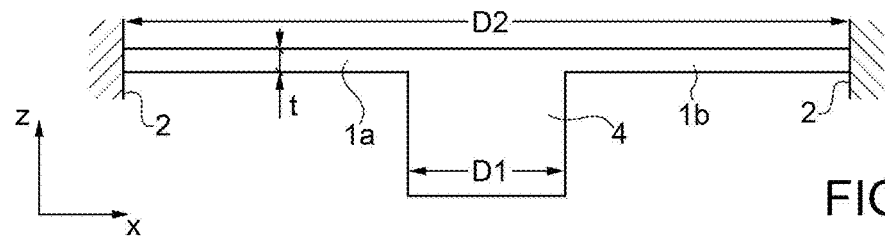
FIGS. 1A and 1B are schematic cross-sectional views of a MEMS piezoelectric structure, in different operating conditions.
Figure 1B:
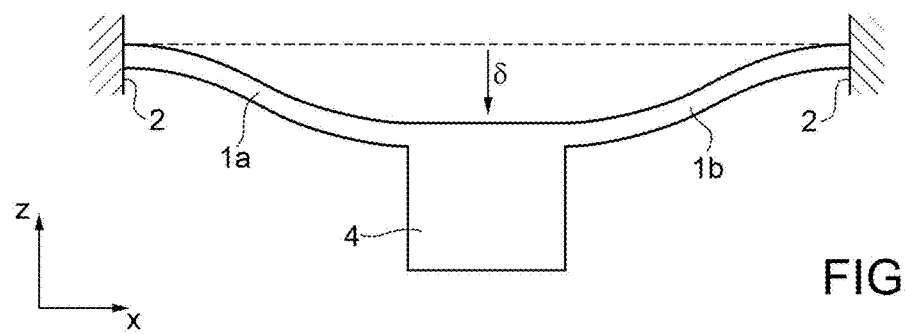
Figure 2A:
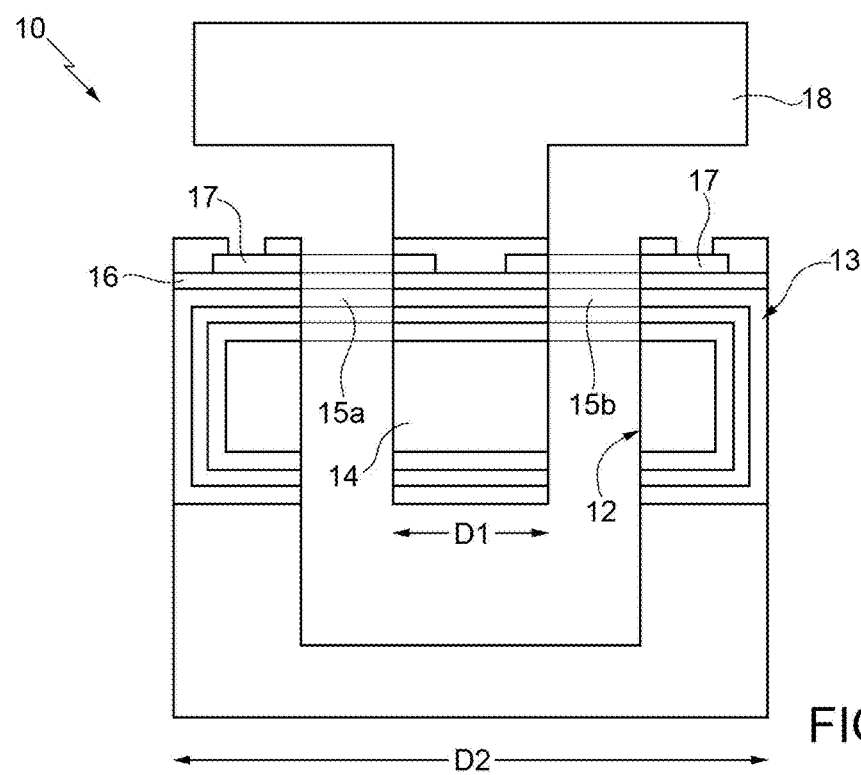
FIG. 2A is a schematic cross-sectional view of a portion of a micromechanical structure of a MEMS piezoelectric device of a known type.
Figure 2B:
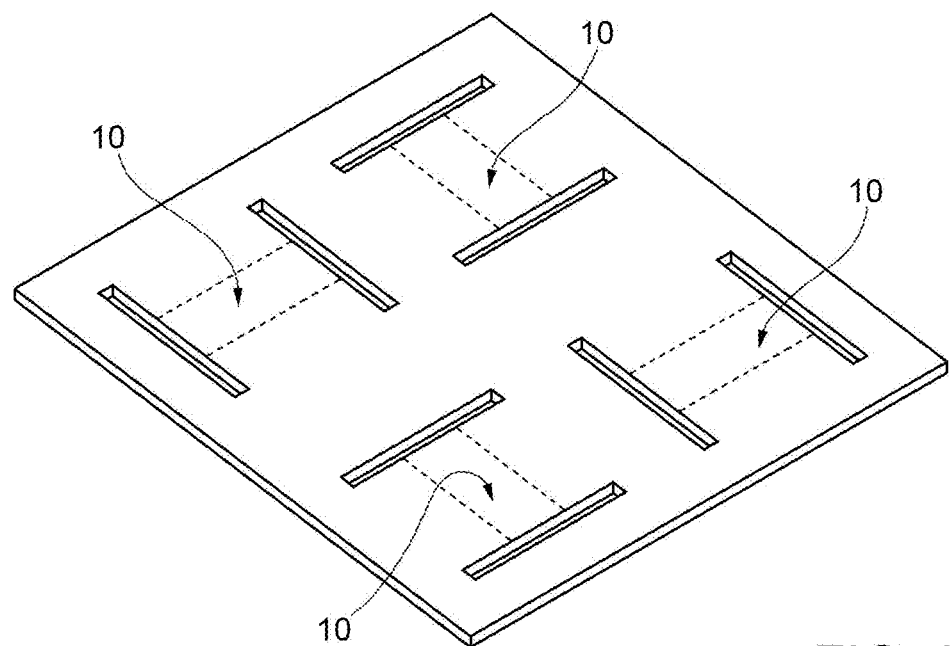
FIG. 2B is a top schematic perspective view of the micromechanical structure of FIG. 2A.
Figure 3A:
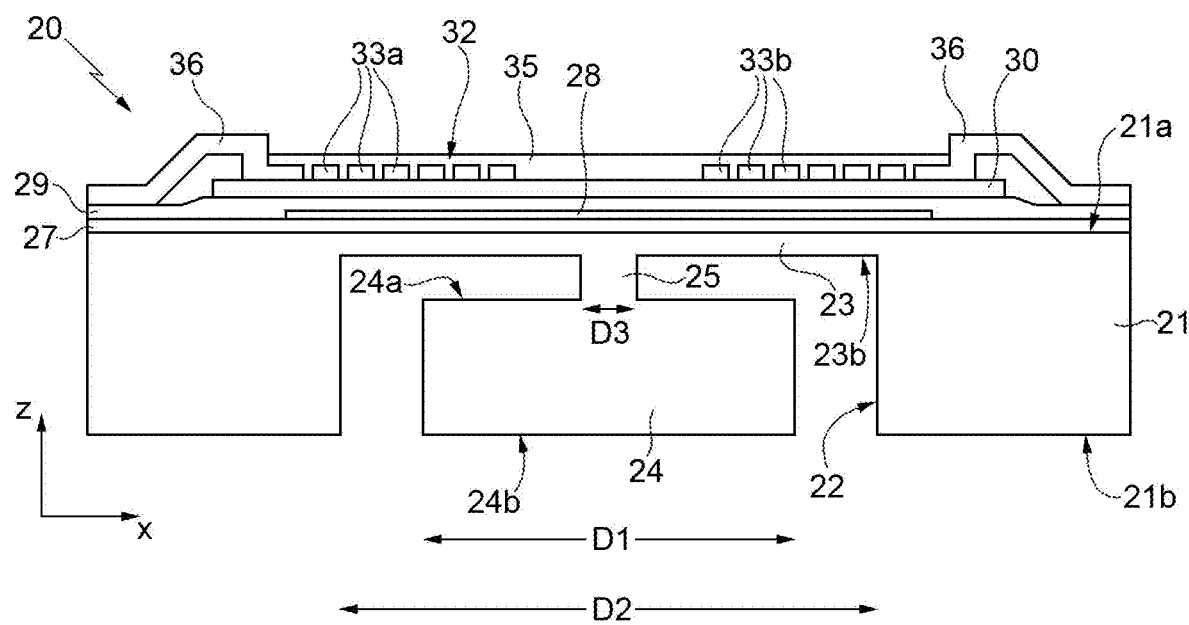
FIG. 3A is a cross-sectional view of a micromechanical structure of a MEMS piezoelectric device according to an embodiment of the present solution.
Figure 3B:
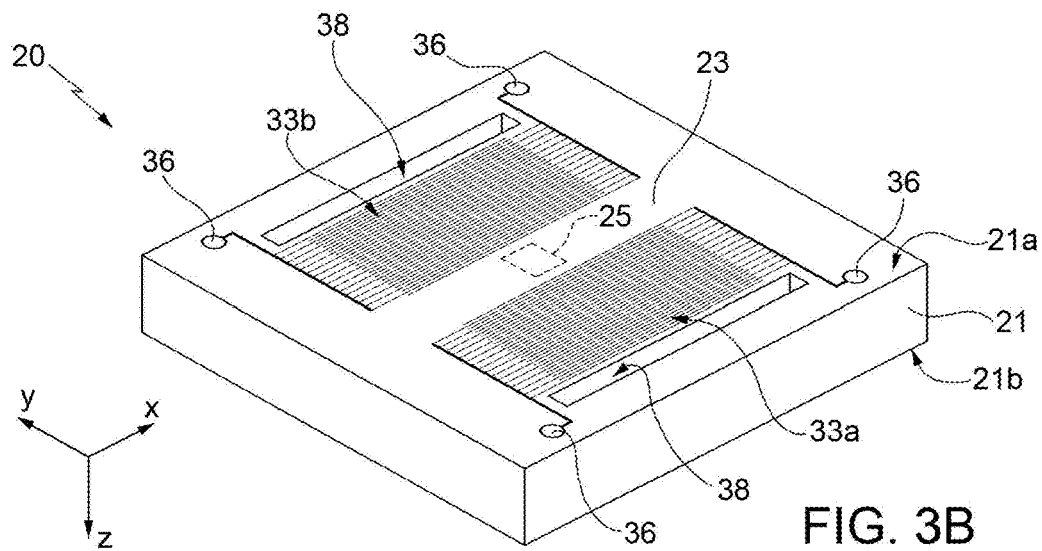
FIG. 3B is a schematic top perspective view of the micromechanical structure of FIG. 3A.

As shown in FIGS. 3A and 3B, a MEMS piezoelectric device 20 comprises a monolithic body 21 of semiconductor material, in particular silicon, having a front surface 21a and a rear surface 21b that lie in a horizontal plane xy defined by a first horizontal axis x and by a second horizontal axis y.

The monolithic body 21 has at the center a housing cavity 22, which extends from the rear surface 21b as far as a membrane 23, which is suspended over the housing cavity 22 at the front surface 21a of the monolithic body 21; in plan view, the membrane 23 and the underlying housing cavity 22 may, for example, have a circular, square, rectangular, or generically polygonal shape.

The MEMS piezoelectric device 20 further comprises a proof mass 24, arranged within the housing cavity 22 and coupled to the membrane 23 by a connection, or support, element 25. This connection element 25 is arranged between a top surface 24a of the proof mass 24 and a bottom surface 23b of the membrane 23, which faces the top surface 24a.

In one embodiment, the connection element 25 has a column configuration and is connected to the membrane 23 at a geometrical center thereof.

The housing cavity 22 surrounds the proof mass 24 laterally (along the first and second horizontal axes x, y) and at the top (a portion of the housing cavity 22 is in fact arranged between the front surface 24a of the proof mass 24 and the membrane 23); the proof mass 24 has a rear surface 24b arranged, in the embodiment illustrated, at the same level as the rear surface 21b of the monolithic body 21.

In particular (see also the schematic representation of FIG. 4), D1 once again designates a lateral extension of the proof mass 24 (parallel to the front surface 21a of the monolithic body 21 in the horizontal plane xy, for example along the first horizontal axis x), and D2 designates a corresponding main extension of the membrane 23 along the same first horizontal axis x.

Figure 4:
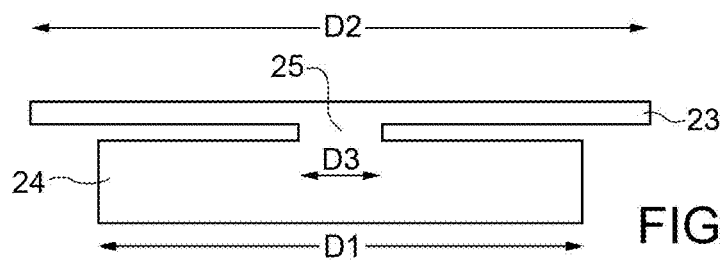
FIG. 4 is a schematic cross-sectional view of a portion of the micromechanical structure of FIG. 3A.

According to one aspect, as is evident from examination of FIG. 3A and also of FIG. 4, sizing of the proof mass 24 is in this case independent of sizing of the membrane 23 (the same membrane designed, as described hereinafter, to carry piezoelectric elements for detecting deformations). The dimension D1 may in this case even advantageously be approximately equal to the dimension D2.

Furthermore, a corresponding dimension of the connection element 25 (in this case, along the first horizontal axis x), designated by D3, is smaller than the dimension D1 of the proof mass 24 (for instance, much smaller, in the example illustrated). In other words, only a central portion of the proof mass 24, with extension much shorter than the entire lateral extension D1 of the proof mass 24 along the first horizontal axis x, is connected to the membrane 23 via the connection element 25.

Figure 10:
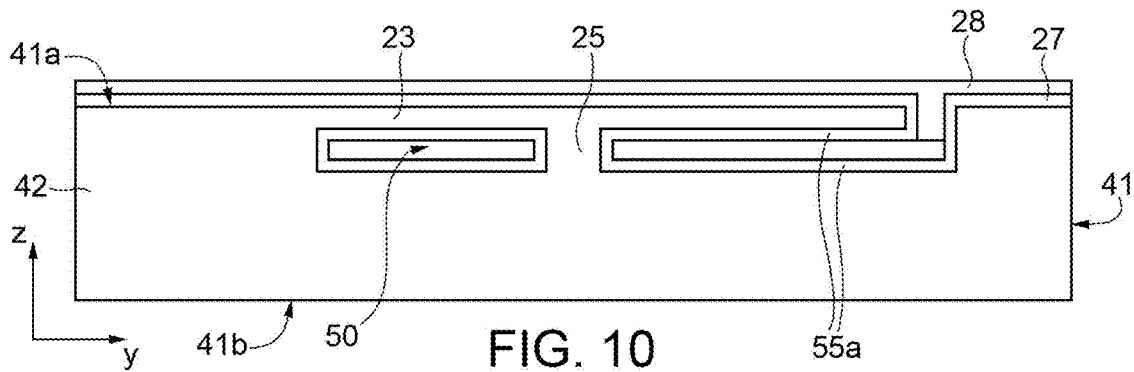

The MEMS piezoelectric device 20 further comprises, on the front surface 21a of the monolithic body 21 and in general above the membrane 23: a first dielectric layer 27, for example an oxide layer, arranged on the front surface 21a of the monolithic body 21; a service layer 28, for example a polysilicon layer, the function of which will be clarified hereinafter with reference to the manufacturing process (see FIG. 10); a second dielectric layer 29, which is also, for example, an oxide layer, arranged above the service layer 28 and the first dielectric layer 27; a piezoelectric material layer 30, for example PZT, arranged on the second dielectric layer 29, vertically in an area corresponding to the membrane 23; an electrode arrangement 32, arranged on, and in contact with, the piezoelectric material layer 30; in particular, the electrode arrangement 32 comprises at least one first set of electrodes 33a and one second set of electrodes 33b, which are arranged above the membrane 23, on opposite sides with respect to the connection element 25 in the horizontal plane xy, for example on opposite sides along the first horizontal axis x, and are designed to enable detection of the deformations of the same membrane 23; a passivation layer 35, for example of silicon oxide or silicon nitride, arranged on the electrode arrangement 32, the piezoelectric material layer 30, and the second dielectric layer 29; and electrical contact elements 36 (the so-called "vias"), which are arranged on the passivation layer 35, and further extend, at least in part, through the same passivation layer 35, for electrically contacting the electrode arrangement 32 and in particular the first and second sets of electrodes 33a, 33b, and in this way enable detection of an electrical signal and execution (as described more fully hereinafter), for example, of energy-harvesting operations.

During operation, the proof mass 24 displaces in response to mechanical vibrations, thus causing deformation of the membrane 23 and of the associated layer of piezoelectric material 30. This deformation is detected by the first and second sets of electrodes 33a, 33b, which supply, through the electrical contacts 36, respective electrical signals for generation of electrical energy starting from the aforesaid vibrations.

As illustrated in FIG. 3B, a release opening 38 may be provided, laterally to the membrane 23 and the proof mass 24, in the example having opening portions extending along the first horizontal axis x and arranged laterally to the proof mass 24 with respect to the horizontal axis y. As will be discussed more fully hereinafter, this release opening 38 defines the mode of constraint of the membrane 23 to the monolithic body 21, in the example being of the doubly clamped type (given that the membrane 23 is coupled to the monolithic body 21 at two sides thereof that extend along the second horizontal axis y).

Furthermore, in a way not illustrated herein (but that will be evident to a person skilled in the field), a supporting body may be coupled underneath the monolithic body 21, at the rear surface 21b, with supporting functions (the supporting body having in this case an appropriate cavity in fluid communication with the housing cavity 22 for providing freedom of movement for the proof mass 24).

A description of a possible process for manufacturing the MEMS piezoelectric device 20 is now provided.

Figure 5:
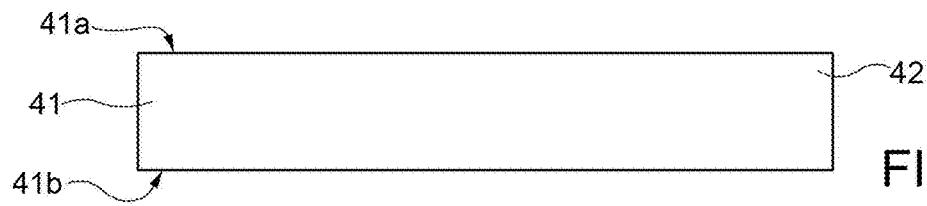
FIGS. 5, 6A-6B, 7, 8A-8C, 9-14 and 15 are schematic cross-sectional views, or schematic plan views, of the micromechanical structure of FIG. 3A in successive steps of a corresponding manufacturing process.

In an initial step of the manufacturing process (see FIG. 5), a wafer 41 of semiconductor material is provided, for example of monocrystalline silicon, comprising a substrate 42, for example of an N type, and having a front surface 41a and a rear surface 41b.

The manufacturing process continues with formation of a buried cavity within the wafer 41, with techniques described in detail for example in U.S. Pat. No. 8,173,513 (European Patent 1577656) (incorporated by reference).

Figure 6A:
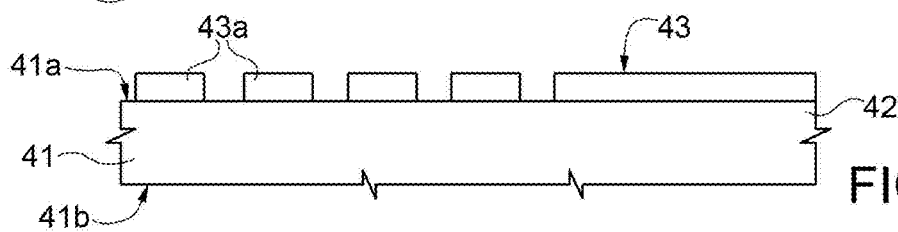
Figure 6B:
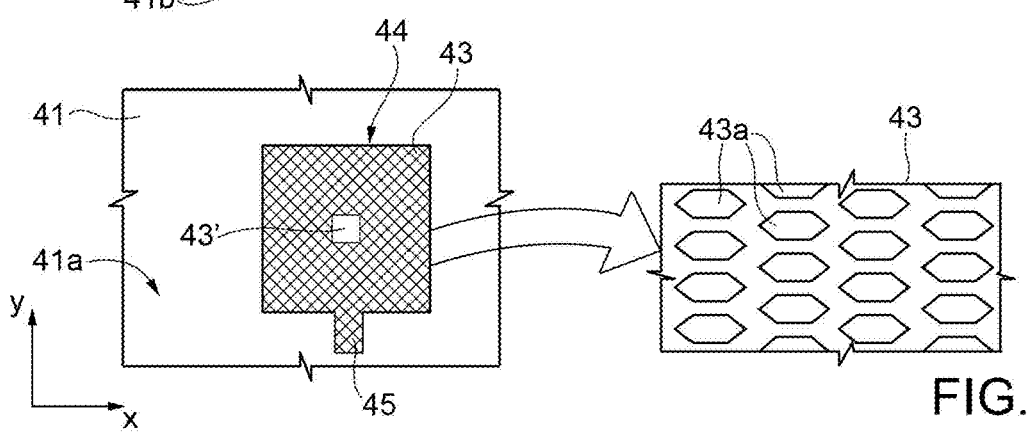

In brief, and as illustrated in FIGS. 6A and 6B (which are not drawn to scale, as likewise the remaining figures), on the front surface 41a of the wafer 41 a resist mask 43 is provided. The mask 43 has, in particular, (see FIG. 6B) an etching area 44, in the example approximately square (but it may also be circular or generically polygonal), and comprises a plurality of mask portions 43a, for example hexagonal, which define a lattice, for example a honeycomb lattice.

As will emerge clearly hereinafter, the etching area 44 of the mask 43 corresponds to the area that will be occupied by the housing cavity 22 and has an extension corresponding to the extension of the membrane 23 (the lateral extension of the mask 43 is thus substantially equal to the dimension D2, along first horizontal axis x).

The mask 43 has a central portion 43', for example having a square or circular or generically polygonal shape in plan view, which corresponds to the positioning of the connection element 25, which in the example also has a square or circular or generically polygonal shape in plan view. In particular, the lateral extension of the central portion 43' of the mask 43 determines the extension D3 of the connection element 25, along first horizontal axis x.

Furthermore, the mask 43 has a lateral prolongation 45, which is arranged at a central axis of the same mask 43 and extends, in the example, along the second horizontal axis y.

Figure 7:
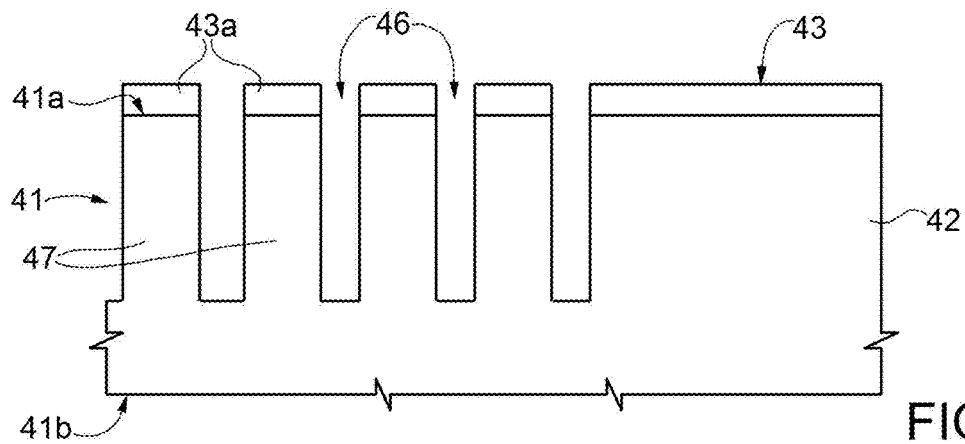

Then (see FIG. 7, which, as FIG. 6A, represents only a small portion of the wafer 41 at an enlarged scale, for reasons of clarity of illustration), using mask 43, an anisotropic chemical etching of the substrate 42 is performed, following upon which trenches 46 are formed, which communicate with one another and delimit a plurality of silicon columns 47. In practice, trenches 46 form an open region of a complex shape (corresponding to the lattice of the mask 43) in which the columns 47 (having a shape corresponding to the mask portions 43a) extend.

Next (see FIG. 8A, which represents a more extensive portion of the wafer 41, as compared to FIGS. 6a and 7), the mask 43 is removed, and an epitaxial growth is carried out in deoxidizing environment (typically, in atmosphere with high concentration of hydrogen, preferably with trichlorosilane —SiHCl$_3$). Consequently, an epitaxial layer 48 (appearing only in FIG. 8A and hereinafter not distinguished from the substrate 42) grows on the columns 47 and closes at the top the aforesaid open region formed by the trenches 46.

A thermal annealing step is then carried out, for example for 30 min at 1190° C., preferably in a reducing atmosphere, typically a hydrogen atmosphere.

The annealing step causes migration of the silicon atoms, which tend to move into a position of lower energy. Consequently, and also thanks to the short distance between the columns 47, the silicon atoms migrate completely from the portions of the columns 47 present within the aforesaid region formed by the trenches 46, and a buried cavity 50 is formed, starting from the same region.

On the buried cavity 50 a thin silicon layer remains, constituted in part by silicon atoms grown epitaxially and in part by migrated silicon atoms, which forms the membrane 23, which is flexible and may deflect in the presence of external stresses.

During the same step of the manufacturing process, the connection element 25 is defined within the buried cavity 50, which extends in particular at the center with respect to the membrane 23, between a top inner surface 50a and a bottom inner surface 50b of the buried cavity 50.

Figure 8A:
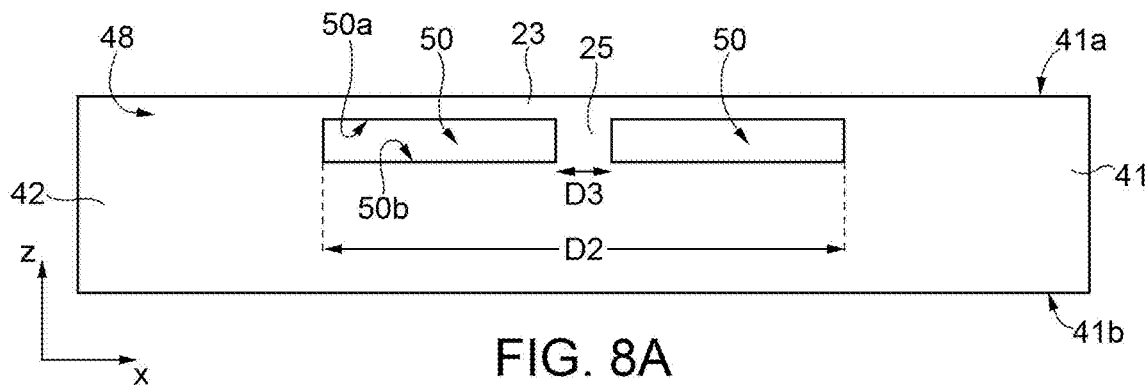
Figure 8B:
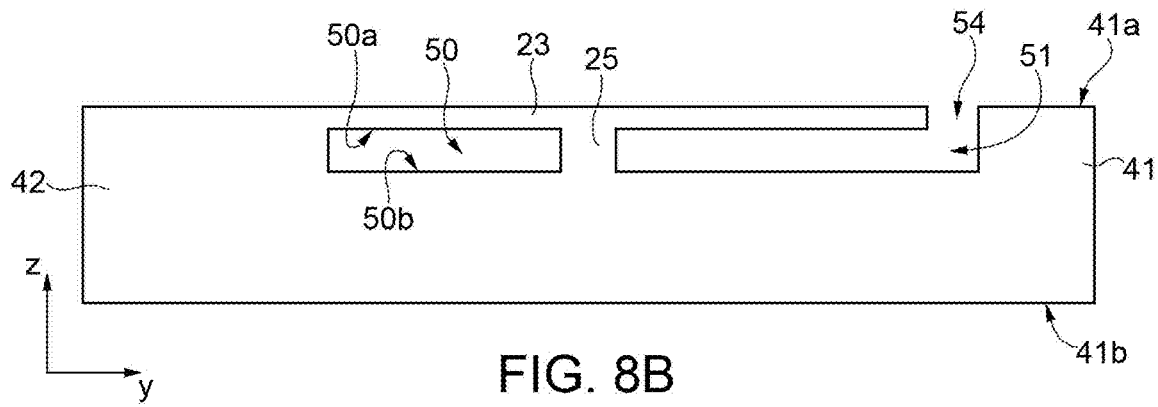
Figure 8C:
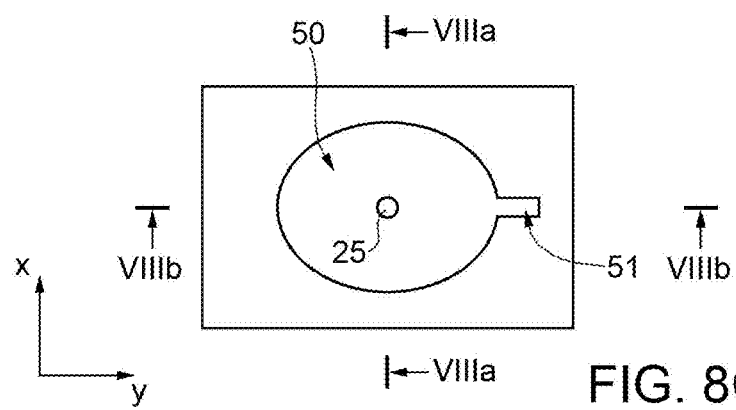

Furthermore, as illustrated in the different cross-section of FIG. 8B and in the corresponding plan view of FIG. 8C (where the lines of section regarding the aforesaid FIGS. 8A and 8B are highlighted), with the same steps of the manufacturing process a buried channel 51 is provided, in the region identified by the lateral prolongation 45 of the mask 43, communicating with the buried cavity 50, laterally thereto (in the example, extending along the second horizontal axis y).

An access trench 54 is then formed through a surface portion of the substrate 42, to reach the buried channel 51, by means of an etching performed from the front of the wafer 41, starting from the front surface 41a.

Figure 9:
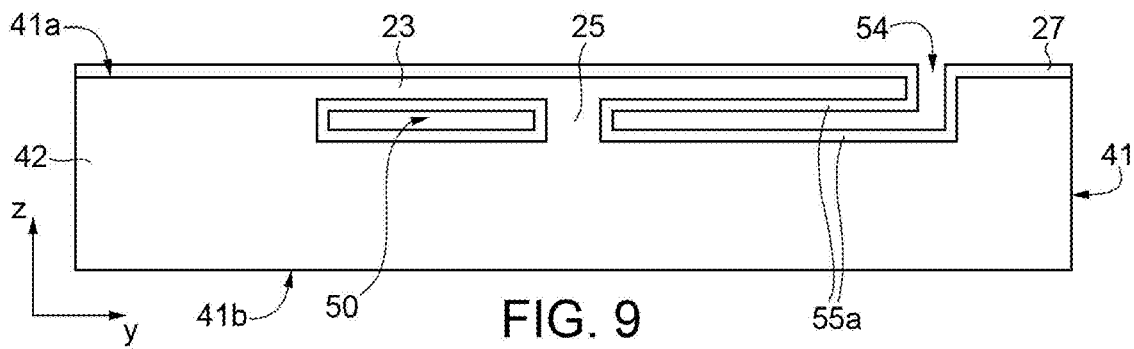

The manufacturing process then continues (FIG. 9) with a step of thermal oxidation within the buried cavity 50 (performed through access trench 54) and on the front surface 41a of the wafer 41, to form the first dielectric layer 27, made, for example, of silicon oxide, SiO$_2$. Following upon this step, in particular, an internal dielectric region 55a is formed, which coats the inner walls of the buried cavity 50 and the inner walls of the access trench 54.

A step of deposition, for example of polysilicon, is then carried out (FIG. 10), which leads to formation of the service layer 28 on the wafer 41 and within the access trench 54, for closing the opening previously provided for the oxidation.

Figure 11:
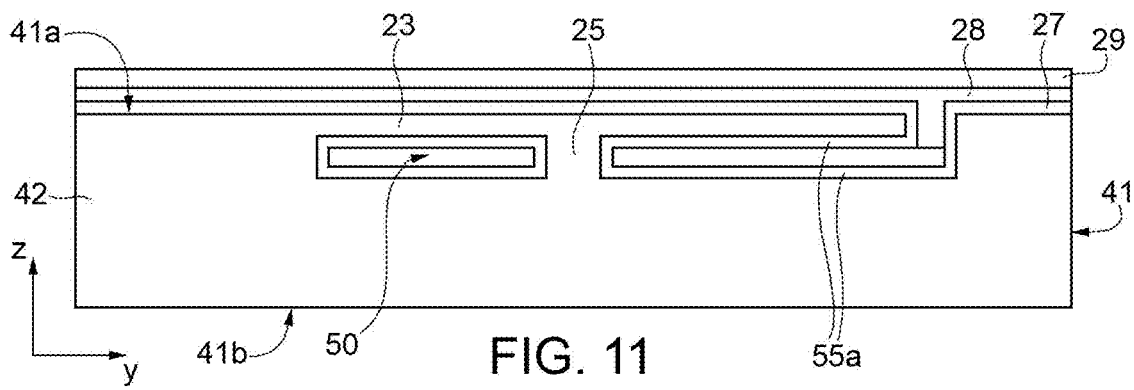
Figure 12:
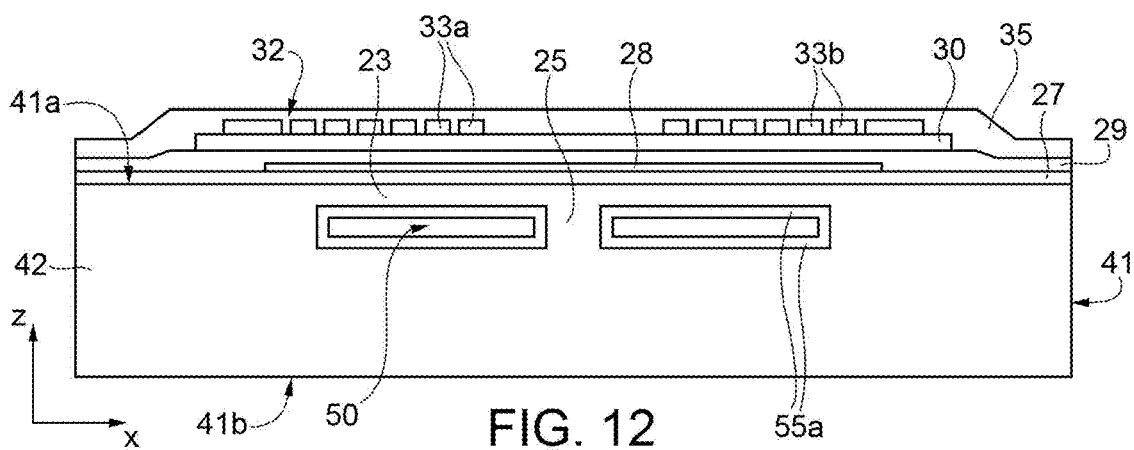

The manufacturing process envisages at this point (FIG. 11) formation of the second dielectric layer 29, on the service layer 28, and then formation, by deposition and subsequent definition, of the piezoelectric material layer 30 on the second dielectric layer 29 (FIG. 12).

In particular, the layer of piezoelectric material 30 may be formed using the technique known as "sol-gel", which envisages successive steps of formation of a colloidal solution (sol), which operates as a precursor for the subsequent formation of a continuous inorganic lattice containing an interconnected liquid phase (gel), through reactions of hydrolysis and condensation. Thermal post-treatments of drying and solidification are generally used for eliminating the liquid phase from the gel, promoting further condensation, contributing to formation of the correct crystallographic phase, and enhancing the mechanical and, consequently, piezoelectric properties.

The piezoelectric material layer 30 is hereinafter defined, so as to have a main lateral extension, along the first horizontal axis x, larger than the dimension D2 of the entire membrane 23, as illustrated in the same FIG. 12.

The manufacturing process then continues with deposition, on the piezoelectric material layer 30, of an electrode layer, for example of titanium/tungsten (TiW), which is then appropriately shaped, as has been described in detail previously, with reference to FIG. 3A, for the formation of the electrode arrangement 32.

The passivation layer 35 is then deposited on the electrode arrangement 32 previously provided, and contact openings are formed (FIG. 13) through the same passivation layer 35 and are subsequently filled with a suitable conductive material, for formation of the electrical contact elements 36.

Figure 13:
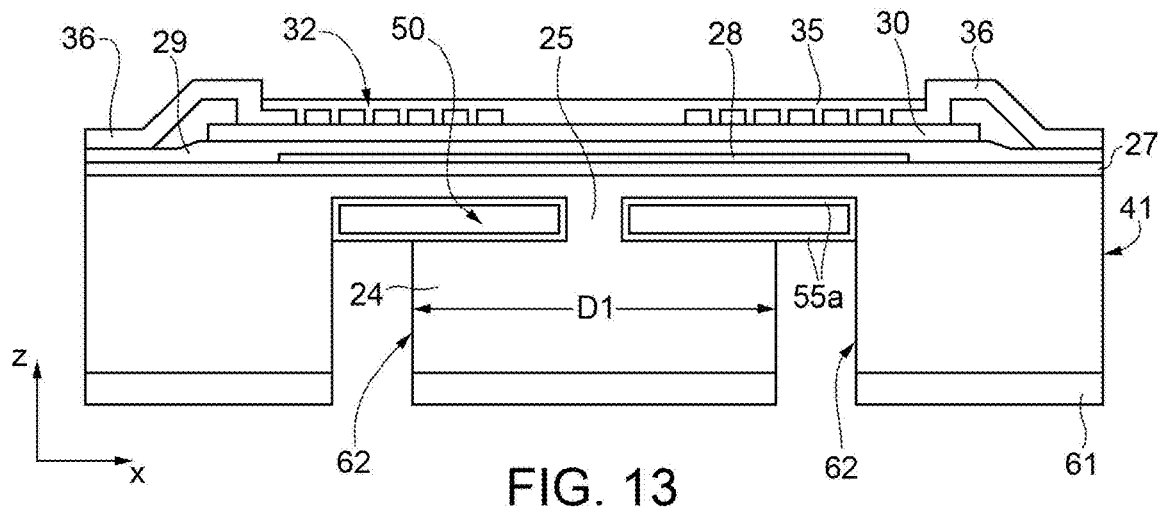

According to an aspect, see once again FIG. 13, an etch mask 61 is then formed on the rear surface 41b of the wafer 41, for etching of the wafer 41 and formation of back trenches 62, reaching the buried cavity 50 from the back. In particular, this etching is performed with etch-stop on the dielectric region 55a, coating a bottom wall of the buried cavity 50.

In this step of the manufacturing process, the extension D1 of the proof mass 25 is determined, according to the positioning and dimensions of the back trenches 62. In particular, the back trenches 62 have in sectional view an outer side wall vertically in a position corresponding to the perimeter of the buried cavity 50, and an inner side wall, whose position defines the aforesaid dimension D1.

It is thus clear that, in the solution described, it is possible to size in a desired way the proof mass 25, in this step of etching from the back of the wafer 41, in a way distinct and separate from the steps of formation and sizing of the membrane 23 (which have been previously carried out).

Figure 14:
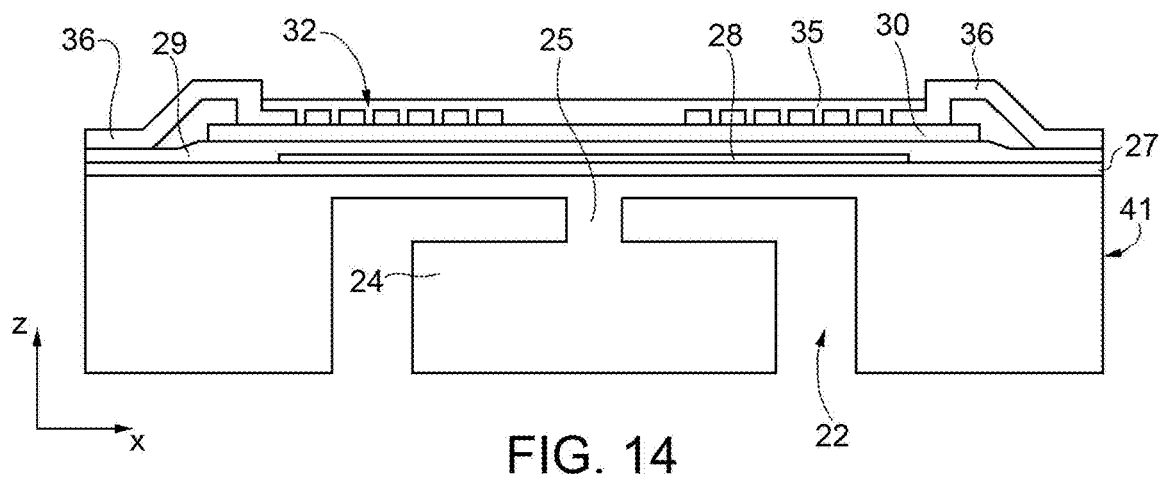

The manufacturing process continues (FIG. 14) with etching of the dielectric region 55a within the buried cavity 50, thus defining entirely the housing cavity 22 within the wafer 41.

According to a further aspect, in a final step of the manufacturing process, the type of constraint may be defined of the membrane 23 to the wafer 41 (or, in a similar way, to the monolithic body 21 that will be obtained after final dicing of the same wafer 41); in this respect, the proposed solution advantageously offers ample freedom of design for adapting to various needs and applications, for example with the possibility of obtaining a solution of a doubly clamped type, of a completely clamped type, or with four points of constraint.

Figure 15:
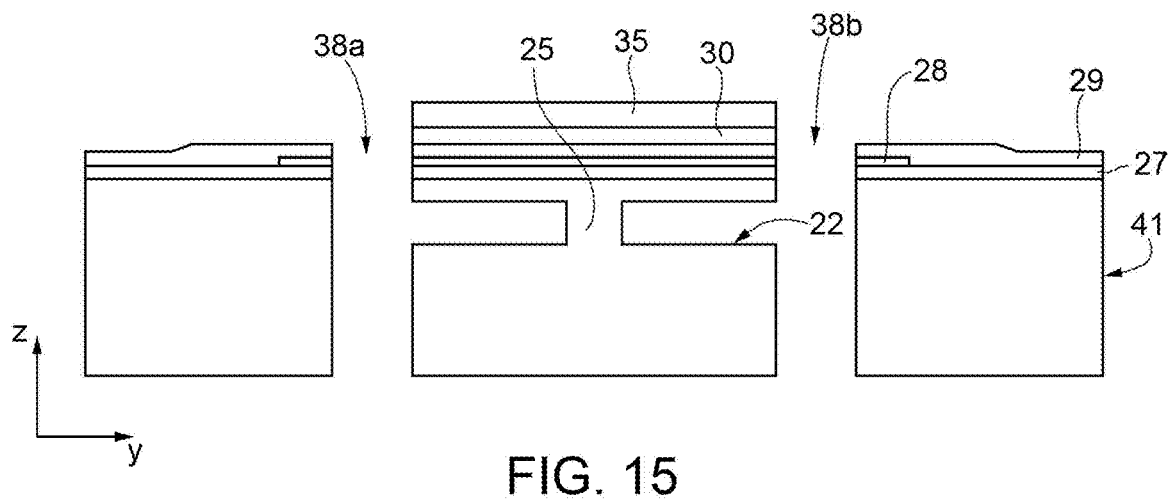

In detail, as illustrated in FIG. 15 (which corresponds to the top perspective view of FIG. 3B, described previously), a further etching of the wafer 41 may then be carried out (in this case, the embodiment is of a doubly clamped type), for example from the back, starting from the rear surface 41b.

This etching, which is carried out through the housing cavity 22, involves an edge portion of the membrane 23 and the layers possibly present on the front surface 41a of the wafer 41, in this case the first dielectric layer 27, the service layer 28, and possibly the second dielectric layer 29.

In particular, the release opening 38 is thus formed, in fluid communication with the housing cavity 22, and comprising in this case (once again referring to the embodiment of a doubly clamped type) a first cavity portion 38a and a second cavity portion 38b, which are arranged alongside the membrane 23, on opposite sides with respect to the second horizontal axis y, and separate the same membrane 23 from the semiconductor material of the wafer 41.

In this embodiment, the membrane 23 is connected to the wafer 41 at two sides, for example the sides parallel to the first horizontal axis x, and is separated from the wafer 41 itself along the other two sides, in the example the sides parallel to the second horizontal axis y.

Figure 16:
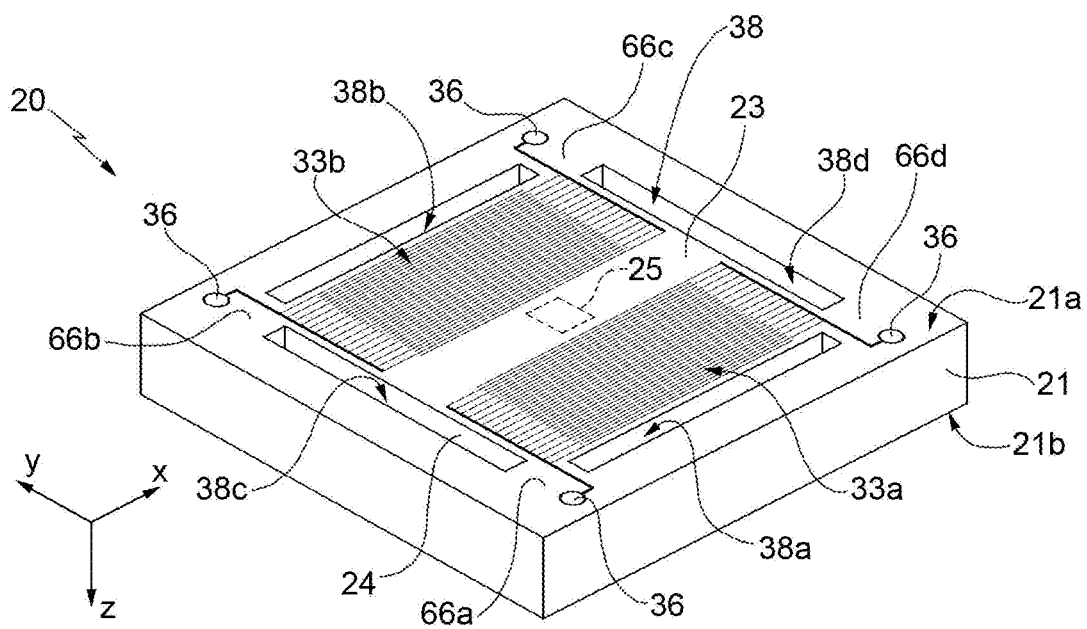
FIGS. 16 and 17A are schematic top perspective views regarding different embodiments of the micromechanical structure.

As illustrated in FIG. 16, a different embodiment, which provides a four-point constraint of the membrane 23 to the wafer 41, envisages providing, by means of the etching described previously, two further cavity portions 38c, 38d of the release cavity 38, which are arranged along the sides of the membrane 23 parallel to the second horizontal axis y, laterally on opposite sides of the membrane 23 with respect to the first horizontal axis x.

Accordingly, the membrane 23 is in this case connected and constrained to the wafer 41 at four vertices thereof (since it has, in the example, a substantially square shape) by connection portions 66a-66d that extend at said vertices, between the membrane 23 and the wafer 41 (as illustrated in the aforesaid FIG. 16).

Figure 17A:
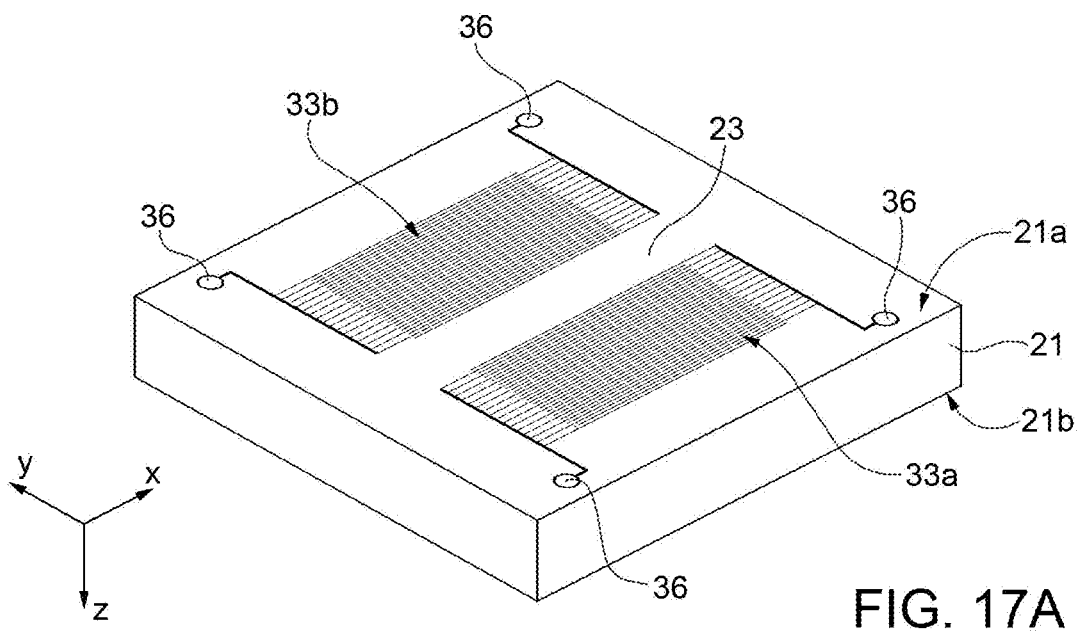
Figure 17B:
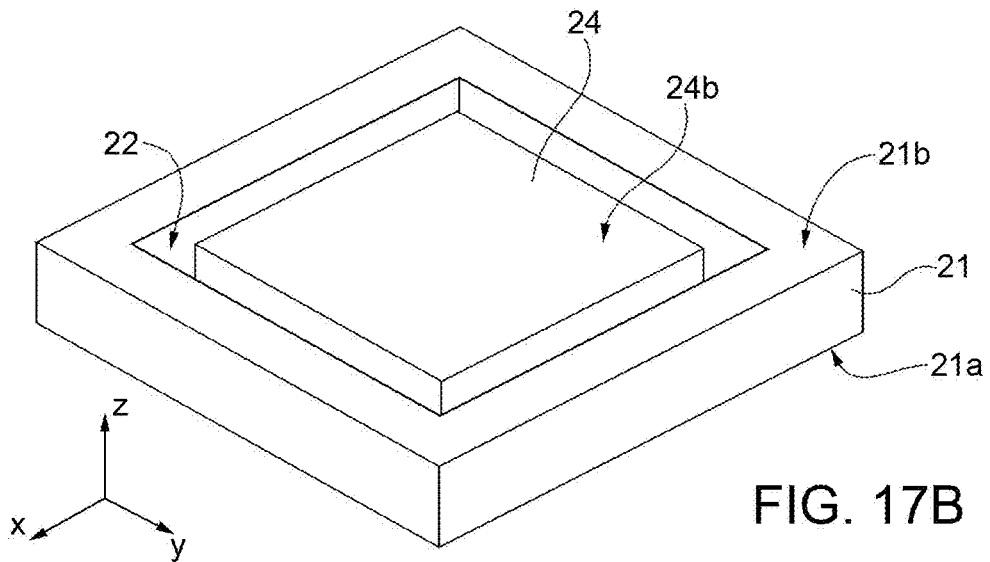
FIG. 17B is a schematic bottom perspective view of the micromechanical structure of FIG. 17A.

FIGS. 17A-17B instead show an embodiment with complete constraint, where the membrane 23 is connected to the wafer 41 along its entire perimeter (in this case, the last etching step, described previously for formation of the release cavity 38, here not present, may thus not be envisaged).

In any case, the manufacturing process terminates with a step of dicing or sawing of the wafer 41, for definition of the dies, each of which comprises the body of semiconductor material 21 and the corresponding piezoelectric structure.

Figure 18:
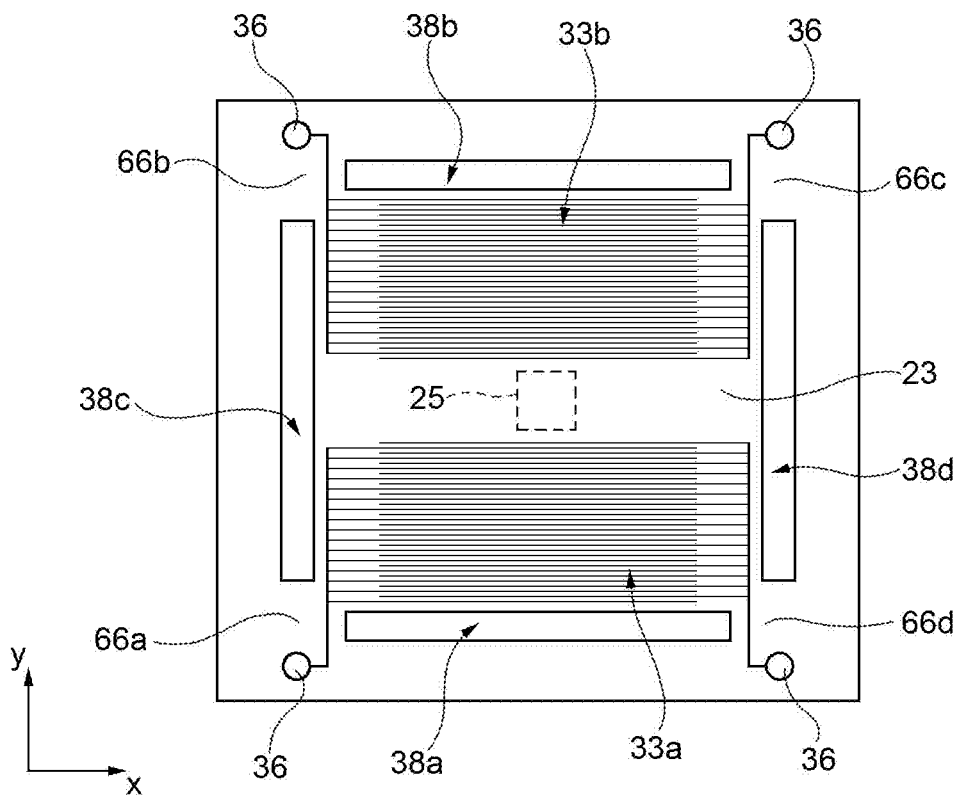
FIGS. 18 and 19 are schematic plan views of further embodiments of the micromechanical structure.
Figure 19:
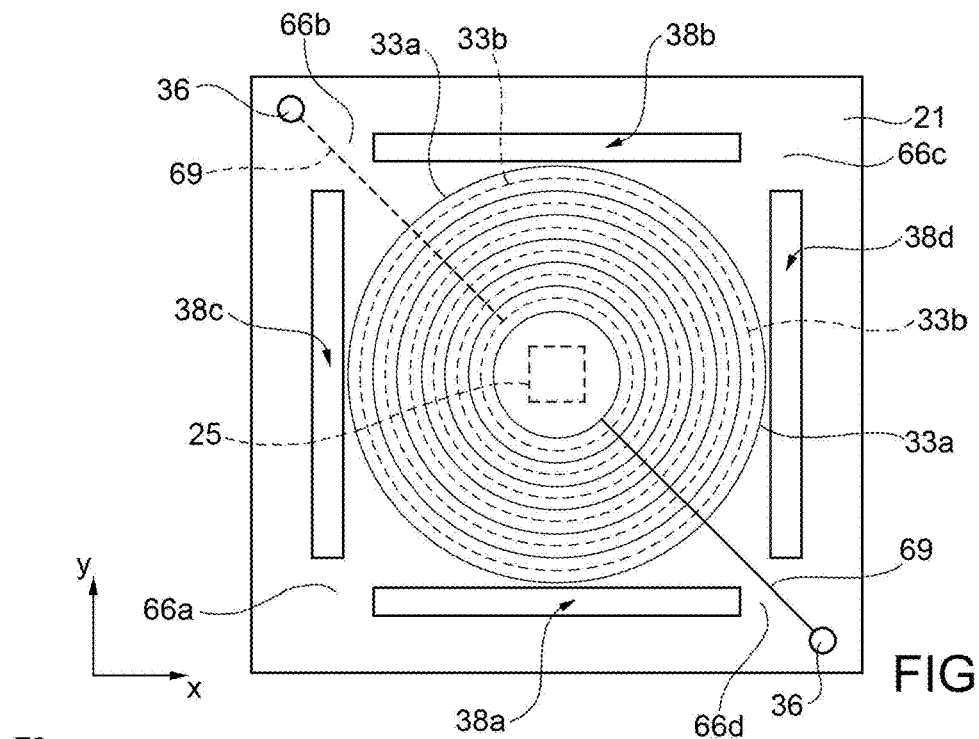

As illustrated in FIGS. 18 and 19, which refer, merely by way of example, to a structure with four points of constraint, a further possibility offered by the present solution regards formation of the electrode arrangement 32.

In particular, as illustrated in FIG. 18, in a possible embodiment, both the first set of electrodes 33a and the second set of electrodes 33b have a comb-fingered configuration, i.e., each comprising a first "comb" and a second "comb" of electrodes, electrically contacted by a respective contact element 36 (in this case, the contact elements 36 being arranged at the four points of constraint).

Alternatively, as illustrated in FIG. 19, the electrode arrangement 32 may be of a circular type. In this case, the first and second sets of electrodes 33a, 33b comprise a respective plurality of rings of electrodes of increasing diameter that depart concentrically from a respective connection element 69 that terminates at a respective contact element 36 (the contact elements 36 being in this case arranged at two diametrically opposite points of constraint).

The advantages of the solution described are clear from the foregoing discussion.

It is underlined, in any case, that it allows to solve the problems highlighted previously afflicting the known solutions for MEMS piezoelectric devices, in particular: using technologies and processes altogether compatible with MEMS-device technologies; having low manufacturing costs and using standard manufacturing processes, with a resulting reduced occupation of area in the integrated implementation (and the possibility of integration with further micromechanical structures, or ASICs); offering ample freedom of design of the proof mass 25, which may in particular have dimensions comparable with the corresponding membrane 23, such as not to require the presence of an additional outer proof mass (in this way, leading to a further reduction of the complexity of production and a marked decrease in defectiveness and costs); and, in general, guaranteeing improved electrical performance, in particular as regards the efficiency in generation of electrical energy starting from mechanical vibrations.

Figure 20:
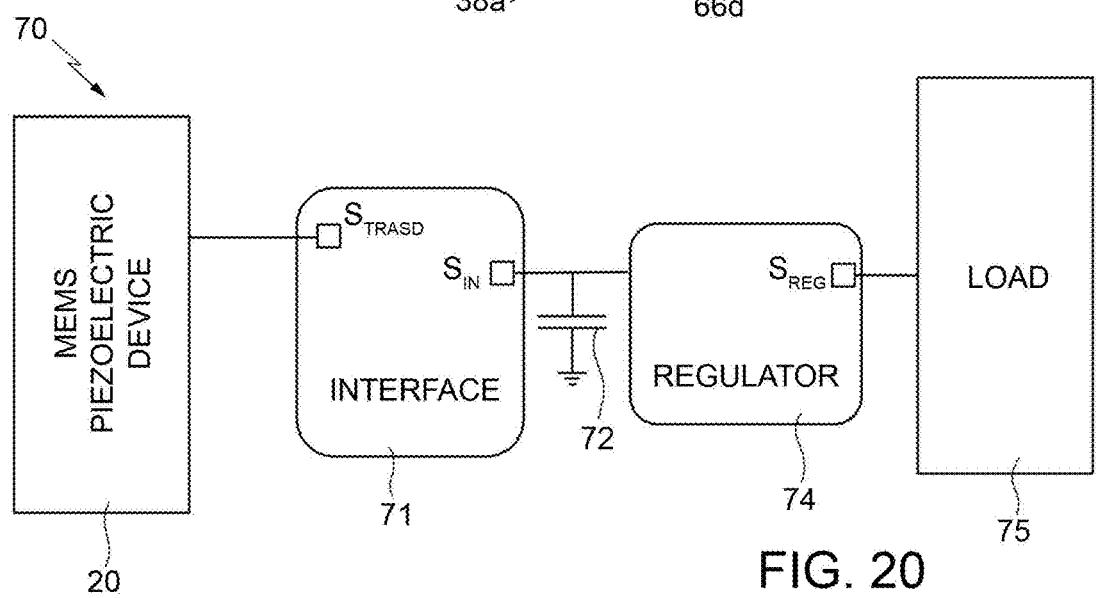
FIG. 20 is a block diagram of a system for harvesting electrical energy that uses the MEMS piezoelectric device as a energy micro-generator.

The aforesaid characteristics render the use of the MEMS piezoelectric device 20 particularly advantageous in an electrical-energy-harvesting system, for use, for example, in a portable electronic apparatus (such as a smartphone), for example of the type represented schematically and by functional blocks in FIG. 20.

In particular, the energy-harvesting system, designated as a whole by 70, comprises the MEMS piezoelectric device 20, used as transducer for conversion of environmental vibrations into electrical energy, to generate a transduction signal $S_{TRANSD}$.

The energy-harvesting system 70 further comprises: an electrical harvesting interface 71, configured to receive at its input the transduction signal $S_{TRANSD}$, appropriately process the same signal, and supply at output a harvesting signal $S_{IN}$; a storage capacitor 72, which is connected to the output of the harvesting interface 71 and receives the harvesting signal $S_{IN}$, which causes charging thereof and consequent storage of energy; and a voltage regulator, or converter 74, connected to the storage capacitor 72 for receiving at its input the electrical energy stored and generating at its output a regulated signal $S_{REG}$, with a suitable value to be supplied to an electric load 75, for its supply or recharging.

As previously mentioned, the energy-harvesting system 70 may advantageously be used for electrically supplying an electrical or electronic apparatus, which may even be without a battery or provided with a rechargeable battery.

Figure 21:
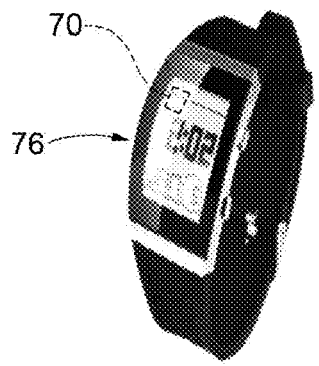
FIG. 21 shows a portable electronic apparatus in which the electrical-energy-harvesting system of FIG. 20 may be used.

By way of example, FIG. 21 shows an electronic apparatus 76, in the example of a portable or wearable type, such as a bracelet or a watch, which incorporates the energy-harvesting system 70 for generation of electrical energy by exploiting mechanical vibrations, in this case originated by the movement of the body of the user. The electronic apparatus 76 may advantageously be used in the field of fitness.

Finally, it is clear that modifications and variations may be made to what has been described and illustrated herein, without thereby departing from the scope of the present invention, as defined in the annexed claims.

In particular, modifications may be made to the shape or dimensions of one or more of the elements that constitute the MEMS piezoelectric device 20; for example, according to the requirements of application and design of the MEMS piezoelectric device 20, the central connection element 25 may have a different shape or a different extension (in the limits of the dimensions of the proof mass 24); for example, it may have an extension elongated along the second horizontal axis y, which may be substantially equal to the corresponding extension of the membrane 23 along the same second horizontal axis y.

Furthermore, the micromechanical structure described previously may in general be used in any MEMS device for generating an electrical signal starting from detected mechanical vibrations, for example, in a piezoelectric accelerometer or in other devices that envisage the use of a proof mass.

The invention claimed is:

1. A process for manufacturing a MEMS piezoelectric device, comprising:

forming a buried cavity within a wafer of semiconductor material, said buried cavity defining from said wafer a membrane positioned between an inner surface of said buried cavity and a top surface of said wafer and further defining from said wafer a connection element extending from a bottom surface of the membrane;

forming a piezoelectric material layer above a top surface of said membrane;

forming an electrode arrangement in contact with the piezoelectric material layer; and etching an opening in said wafer from a bottom surface of said wafer to reach said buried cavity and define from the wafer a proof mass coupled to the membrane through the connection element and surrounded by said opening;

wherein forming the buried cavity comprises:

forming an etch mask on the top surface of said wafer, a geometry of said etch mask configured to define a geometry and dimensions of said membrane and of said connection element;

using the etch mask to form trenches within said wafer which delimit walls of semiconductor material;

epitaxially growing, starting from said walls, a closing layer of semiconductor material, said closing layer closing at a top said trenches and enabling formation of said membrane; and carrying out a thermal treatment such as to cause migration of the semiconductor material of the walls and form the buried cavity and at a same time defining said connection element and said membrane.

2. The process of claim 1, wherein forming said buried cavity further comprises forming a buried channel as a lateral prolongation of said buried cavity.

3. The process of claim 2, further comprising:

forming an access trench through a surface portion of said wafer to reach the buried channel; and carrying out a thermal oxidation within the buried cavity through the access trench to form an internal dielectric region which coats inner walls of the buried cavity and of the access trench.

\* \* \* \* \*